United States Patent [19]

Nagazawa et al.

[11] 4,427,760

[45] Jan. 24, 1984

[54] PHOTOHARDENABLE MATERIALS

[75] Inventors: Kohtaro Nagazawa, Minami Ooizumi; Tsutomu Satoh, Kashiwa; Kunio Morikubo, Souka; Fujio Tanaka, Koshigaya; Masaki Okuyama, Nagareyama, all of Japan

[73] Assignee: Somar Manufacturing Co. Ltd., Tokyo, Japan

[21] Appl. No.: 387,130

[22] Filed: Jun. 10, 1982

[30] Foreign Application Priority Data

Jun. 10, 1981 [JP] Japan .................................. 56-89100

[51] Int. Cl.$^3$ ............................................. G03C 1/68
[52] U.S. Cl. .................................... 430/287; 430/280; 430/288; 430/910; 430/927; 204/159.14; 204/159.15; 204/159.16
[58] Field of Search ............... 430/280, 287, 288, 910, 430/927; 204/159.14, 159.15, 159.16

[56] References Cited

U.S. PATENT DOCUMENTS

3,754,054  8/1973  Kimura et al. ............. 204/159.15 X
4,284,707  8/1981  Nagasawa et al. ......... 204/159.16 X

OTHER PUBLICATIONS

J. D. Nordstrom and J. E. Hinsch, "Acrylic Copolymers for Radiation-Cured Coatings", *Industrial and Engineering Chemistry, Product Research and Development*, vol. 9, No. 2, 1970, pp. 155-158.

*Primary Examiner*—John E. Kittle
*Assistant Examiner*—C. Hamilton
*Attorney, Agent, or Firm*—Sughrue, Mion, Zinn, Macpeak and Seas

[57] ABSTRACT

A photohardenable material is disclosed. The material is comprised of a copolymer (I') having ethylenically unsaturated bonds and having an acid value of about 5 to 180 and a molecular weight of about 1,500 to 100,000. The copolymer (I') is obtained by reacting carboxyl groups with a copolymer represented by the structural formula (I), as defined within the application. The material is further comprised of a copolymer (II) having a molecular weight of about 50,000 to 500,000. The copolymer (II) is comprised of three monomers whose structural formula is also defined within the application. The material is further comprised of a cross-linking agent having two or more ethylenically unsaturated bonds and a photoactivator. The copolymers (I') and (II) are present in a ratio of about 0.5 to 20.

5 Claims, No Drawings

PHOTOHARDENABLE MATERIALS

FIELD OF THE INVENTION

The present invention relates to photohardenable materials which can be used for processing materials having adhesion difficulties or other materials such as printing plate materials used for printing, for example, multilayer metal plates having a chromium face, gravure rolls having a copper, nickel or chromium face, or screens, etc., and for chemical milling of materials such as chromium, nickel or stainless steel, etc. In greater detail, the present invention provides photohardenable pattern-forming materials capable of carrying out alkali development.

BACKGROUND OF THE INVENTION

In the past, in order to process materials having a poor adhesive property as described above, photohardenable materials comprising 6-valent chromium as a photosensitive source, for example, chromium-polyvinyl alcohol photosensitive materials, have been used exclusively. However, such materials are unpopular now due to the pollution problems they create. Therefore, photohardenable materials which can be developed with organic solvents have been used. However, the solvents used in connection with these materials cause air pollution and may cause safety or sanitation problems. Thus, photohardenable materials which can be developed with a so-called alkali developing solution obtained by dissolving an alkaline compound in water or a water-organic solvent mixture have been proposed as photosensitive materials. However, the only example of the commercially available materials is diazo resin photohardenable materials. They are not generally used because various difficulties are created by their adhesive property of patterns with respect to materials having a smooth metal face. The photohardenable materials capable of carrying out alkali development are only used for materials having a physically or chemically matted surface. For example, they are used for lithographic printing materials such as a matted aluminum plate, or printed circuit boards having a sanded copper clad, etc. On the other hand, the photohardenable materials using diazo resins can be developed with neutral water or an alkaline developing solution. However, the use of such presents disadvantages with respect to pattern reproduction, sharpness of edges and preservation stability. Moreover, since decomposition of the diazo resins is accelerated by metal, they are not suitable for processing materials having a metal face as described above.

SUMMARY OF THE INVENTION

The photohardenable materials of the present invention suitable for image pattern formation are photohardenable materials which can be developed with an aqueous alkali solution (or developer). For example, they can be employed for presensitized printing plates with aluminum or multimetal, resist materials for fabrication of various substrates, or color image forming materials provided on a transparent plastic film, as illustrated in the following description.

The present invention relates to photohardenable materials which comprise a copolymer (I') having ethylenically unsaturated bonds and having an acid value of about 5 to 180 and a molecular weight of about 1,500 to 100,000 obtained by reacting carboxyl groups of a copolymer represented by the formula (I)

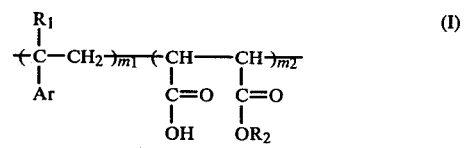

wherein Ar represents a phenyl group or a substituted phenyl group (examples of the substituent include a methyl group, a methoxy group and a chlorine atom); $R_1$ represents a hydrogen atom or a methyl group; $R_2$ represents a lower alkyl group (examples of the lower alkyl group include those having 1 to 4 carbon atoms such as a methyl group, an ethyl group, an n-propyl group, an isopropyl group, an n-butyl group, an isobutyl group and a tert-butyl group); and the numbers $m_1$ and $m_2$ represent each a ratio of each monomer in the copolymer, wherein they have a relation of $m_1 \geq m_2$, with a compound having an oxirane ring and an ethylenically unsaturated bond, a copolymer (II) having a molecular weight of about 50,000 to 500,000 composed of three monomers represented by the formula (II)

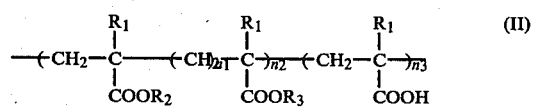

wherein $R_1$ represents a hydrogen atom or a methyl group; $R_2$ represents a lower alkyl group (examples of the lower alkyl group include those having 1 to 4 carbon atoms such as a methyl group, an ethyl group, an n-propyl group, an isopropyl group, an n-butyl group, an isobutyl group and a tert-butyl group); $R_3$ represents a benzyl group, a substituted benzyl group having substituents on the phenyl ring, a tert-butyl group or an isobutyl group, but $R_2 \neq R_3$; and the numbers $n_1$, $n_2$ and $n_3$ represent each a ratio of each monomer in the copolymer, wherein they have relations of $n_1 < n_2$ and about $20 \geq (n_1 + n_2)/n_3 \geq$ about 1, a cross-linking agent having two or more ethylenically unsaturated bonds, and a photoactivator, wherein a ratio by weight of the copolymer (I') to the copolymer (II) is in a range of (I')/(II) of from about 0.5 to 20.

DETAILED DESCRIPTION OF THE INVENTION

First of all, each component composing the photohardenable materials of the present invention is described in detail. The copolymer (I') and the copolymer (II) have free carboxyl groups so that they are soluble in an alkaline developing solution.

The copolymer (I') is obtained by reacting a part of carboxyl groups of a copolymer composed of styrene or a derivative thereof such as α-methylstyrene, m-methoxystyrene, p-methoxystyrene, o-chlorostyrene or p-chlorostyrene, etc., and one kind of maleic acid lower alkyl monoesters such as monomethyl maleate, monoethyl maleate, mono-n-propyl maleate, mono-isopropyl maleate, mono-n-butyl maleate, mono-isobutyl maleate or mono-tert-butyl maleate, etc., with a compound having an oxirane ring and an ethylenically unsaturated bond. Examples of the above-described compound having an oxirane ring and an ethylenically unsaturated bond include glycidyl acrylate, glycidyl methacrylate, allyl glycidyl ether, glycidyl α-ethylacrylate, crotonyl glycidyl ether, glycidyl crotonate and glycidyl isocrotonate, etc., with glycidyl methacrylate, crotonyl glycidyl ether, glycidyl crotonate and glycidyl isocrotonate being preferred and with glycidyl methacrylate being particularly preferred.

As described in the Comparative Examples, if the ratio of free carboxyl groups in the copolymer (I') is high, the apparent photohardening rate and the sensitivity decrease. Furthermore, image patterns are swollen by the alkaline developing solution during development. Consequently, it is difficult to obtain sharp images. Inversely, if the amount of free carboxyl groups is small, the developing time is prolonged and fine development scums generally remain, resulting in inferior images. Accordingly, the acid value of the copolymer (I') should be in a range of about 5 to 180, preferably about 30 to 120.

The copolymer (I') can be synthesized by known methods, examples of which are described in the following.

PREPARATION EXAMPLE 1

1 liter of benzene, 62.4 g of styrene and 58.8 g of maleic anhydride were put in a reactor equipped with a reflux condenser, a nitrogen inlet and a stirrer to make a solution in a nitrogen atmosphere. To the solution, 0.6 g of benzoyl peroxide was added to carry out the reaction for 1 hour under reflux. The separated high molecular weight substance was filtered out and dried to obtain 91.5 g of poly(styrene-co-maleic anhydride). Then, 50 g of the above-described copolymer was dispersed in 270 g of isopropyl alcohol. After being allowed to react at 82° to 83° C. for 28 hours by adding 0.1 ml of 35% HCl, 1 ml of a 4% solution of NaOH in methanol was added thereto. After being stirred, isopropyl alcohol was distilled off to concentrate to ⅔ to ½ of the volume of the reacting solution. The resulting concentrated solution was poured into 1 liter of ISO-PAR-E (alkane solvent produced by ESSO in U.S.A.) with stirring. The precipitate was filtered out and dried to obtain 46 g of poly(styrene-co-monoisopropyl maleate). Acid value: 177, styrene:monoisopropyl maleate=1.5:1 (molar ratio).

25.0 g of the above-described copolymer was dissolved in 100 ml of methyl ethyl ketone. After adding 1.6 mg of di-tert-butylcresol (thermal polymerization inhibitor), the reaction was carried out for 8 hours under reflux by adding 6.8 g of glycidyl methacrylate and 1.1 g of triethylbenzylammonium chloride (addition catalyst). After the reaction, 25 ml of methyl ethyl ketone was added. The mixture was stirred uniformly and poured into 2.5 liters of water with vigorously stirring to separate the product. The precipitate was washed with water and dried to obtain 29 g of poly(styrene-co-monoisopropyl maleate-co-hydroxypropyl methacrylate). Acid value: 78. Conversion of glycidyl methacrylate: 92.5%. Further, an introduction ratio of glycidyl methacrylate into carboxyl groups of the starting material, poly(styrene-co-monoiospropyl maleate) was 47%.

PREPARATION EXAMPLES 2 TO 11

Examples of copolymers (I') prepared in the same manner as in Preparation Example 1 are shown in Table 1.

TABLE 1

| Preparation Example | Poly(styrene-co monoalkyl maleate) | Compound Having an Oxirane Ring and an Ethylenically Unsaturated Bond | Acid Value of Copolymer (I') |
|---|---|---|---|
| 2 | Poly(styrene-co-isopropyl maleate)*1 (1:1) | Glycidyl methacrylate | 82 |
| 3 | Poly(styrene-co-isopropyl maleate)*1 (1:1) | Glycidyl methacrylate | 120 |
| 4 | Poly(styrene-co-isopropyl maleate)*1 (1:1) | Glycidyl methacrylate | 3 |
| 5 | Poly(styrene-co-isopropyl maleate)*1 (1:1) | Glycidyl methacrylate | 195 |
| 6 | Poly(chlorostyrene-co-monoethyl maleate)*2 (1:1) | Glycidyl methacrylate | 32 |
| 7 | Poly(chlorostyrene-co-monoethyl maleate)*2 (1:1) | Glycidyl methacrylate | 77 |
| 8 | Poly(styrene-co-mono-tert-butyl maleate) (2:1) | Glycidyl methacrylate | 20 |
| 9 | Poly(styrene-co-mono-tert-butyl maleate) (2:1) | Allyl glycidyl ether | 24 |
| 10 | Poly(α-methylstyrene-co-monoethyl maleate) (3:1) | Allyl glycidyl ether | 40 |
| 11 | Poly(styrene-co-mono-n-butyl maleate) (1.5:1) | Glycidyl methacrylate | 55 |

*1 The figure in the parenthesis means a molar ratio.
*2 Chlorostyrene is a mixture of 65% of o-compound and 35% of p-compound.

The copolymers (II) can be synthesized by copolymerizing monomers exemplified in the following (1) to (3) by selecting one monomer from each of the groups. Namely, (1) methacrylic acid derivatives such as methyl methacrylate, ethyl methacrylate, n-propyl methacrylate, isopropyl methacrylate, n-butyl methacrylate, isobutyl methacrylate, tert-butyl methacrylate, etc., or acrylic acid analogues such as methyl acrylate; (2) methacrylic acid derivatives such as benzyl methacrylate, p-methoxy benzyl methacrylate, m-methylbenzyl methacrylate, p-chlorobenzyl methacrylate, p-methoxybenzyl methacrylate, p-ethylbenzyl methacrylate, p-isopropylbenzyl methacrylate, isobutyl methacrylate, tert-butyl methacrylate, etc., or acrylic acid analogues such as benzyl acrylate; and (3) methacrylic acid or acrylic acid. It has been ascertained experimentally that copolymers wherein the monomer (1) and the monomer (2) are not identical and the molar amount of the monomer (2) is larger than that of the monomer (1) are most preferred in the viewpoint of photosensitivity. Namely, if the molar ratios of the monomers (1) to (3) in the copolymer are represented by $n_1$, $n_2$ and $n_3$, respectively, it is desired to have a relation of $n_1 < n_2$. Further, it is most desired that $n_1$, $n_2$ and $n_3$ have a relation of about $20 \geq (n_1+n_2)/n_3 \geq$ about 1.

When $(n_1+n_2)/n_3 <$ about 1, the amount of free carboxyl groups increases to the extent that they tend to cause swelling of the photohardened images. However, when $(n_1+n_2)/n_3 <$ about 20, the non-exposed part is difficult to remove by development. Examples of copolymer (II) having a molecular weight of about 50,000 to 500,000 or so are used generally. If the molecular weight is too small, the photohardened or photocrosslinked part tends to dissolve away by the action of developer during development, thus having a tendency to create a so-called "slender image". The above-described relationships agree with the tendency observed in the copolymer (I). It is necessary that the amount of carboxyl groups and the molecular weight are in certain ranges in order to obtain high quality patterns.

The copolymer (II) can be synthesized easily by known processes. Examples of some useful processes are described in the following.

PREPARATION EXAMPLE 12

535 g of water, 79.2 g of benzyl methacrylate, 15 g of methyl methacrylate, 12.9 g of methacrylic acid, 1 g of benzoyl peroxide, 0.3 ml of n-dodecylmercaptan (polymerization regulator) and 2.4 g of polyethylene oxide (produced by Union Carbon and Carbide Co.; Polyox-WSR-N-80, molecular weight: 200,000) were put in a reactor equipped with a nitrogen inlet and a stirrer and allowed to react under a nitrogen atmosphere for 5.5 hours at a stirring rate of 700 to 800 rpm. After filtration, washing with water and drying, 94 g of poly(benzyl methacrylate-co-methyl methacrylate-co-methacrylic acid) beads was obtained. Yield: 88%. $[\eta]_{MC}^{25°C.}=0.231$ (MC: Methyl Cellosolve). Acid value: 41. Percent methoxy content: 3.24%. The molar ratio of monomers was calculated from the above-described acid value and percent methoxy content. Based on such calculations the molar ratios of benzyl methacrylate:methyl methacrylate:methacrylic acid are 73:16:11.

PREPARATION EXAMPLES 13 TO 19

Examples of copolymers (II) prepared in the same manner as in Preparation Example 12 are shown in Table 2.

TABLE 2

| Preparation Example | Copolymer (II) | Molar* Ratio | Acid Value |
|---|---|---|---|
| 13 | Poly(tert-butyl methacrylate-co-benzyl methacrylate-co-methacrylic acid) | 14:72:14 | 45 |
| 14 | Poly(tert-butyl methacrylate-co-benzyl methacrylate-co-methacrylic acid) | 23:59:18 | 66 |
| 15 | Poly(methyl methacrylate-co-tert-butyl methacrylate-co-methacrylic acid) | 20:58:22 | 96 |
| 16 | Poly(methyl methacrylate-co-tert-butyl methacrylate-co-methacrylic acid) | 18:71:11 | 47 |
| 17 | Poly(methyl methacrylate-co-isobutyl methacrylate-co-methacrylic acid) | 15:55:30 | 170 |
| 18 | Poly(ethyl acrylate-co-benzyl methacrylate-co-methacrylic acid) | 25:65:10 | 51 |
| 19 | Poly(ethyl acrylate-co-tert-butyl methacrylate-acrylic acid) | 26:53:21 | 87 |

*Percent by mol. The order of monomers in the molar ratio is equal to that of monomers in the formula of each copolymer (II).

If the photohardenable materials contain only copolymer (I') and not copolymer (II), their preservation stability is inferior because gelation easily occurs. Furthermore, when the photohardenable material is applied to the substrate and dried, it will stick to an extent causing the coating layer to transfer to the original when the original is brought into tight contact with the photohardenable material. Accordingly, they suffer from many practical difficulties. Photohardenable materials which contain only copolymer (II) and not copolymer (I') have inferior adhesion of photohardened parts to a smooth metal surface. Further, it is observed that the photosensitivity of photohardenable materials is lower than that when the material also contains copolymer (I'). Evaluation of photohardenable materials containing either the copolymer (I') or the copolymer (II) alone is described in the Comparative Examples stated hereinafter.

It has been found that the above-described faults can be overcome when the ratio by weight of the copolymer (I') to the copolymer (II) is established in a range of (I')/(II) of from about 0.5 to 20. By maintaining this ratio, excellent photohardenable materials can be obtained.

The cross-linking agent having two or more ethylenically unsaturated bonds which have been found to be useful have a boiling point of about 150° C. or more under atmospheric pressure and contain an ethylenically unsaturated bond or bonds as an acryl residual group, a methacryl residual group or an allyl residual group. Examples of them include furfuryl acrylate, diethylene glycol diacrylate, triethylene glycol diacrylate, tetraethylene glycol diacrylate, hexamethylene glycol diacrylate, neopentyl glycol diacrylate, trimethylolpropane diacrylate, trimethylolpropane triacrylate, tetramethylolmethane tetraacrylate, resorcinol diacrylate, p,p'-dihydroxydiphenyl diacrylate and bisphenol A diglycidyl diacrylate, methacrylate analogues of them, namely, furfuryl methacrylate, diethylene glycol dimethacrylate, triethylene glycol dimethacrylate, tetraethylene glycol dimethacrylate, hexamethylene glycol dimethacrylate, neopentyl glycol dimethacrylate, trimethylolpropane dimethacrylate, trimethylolpropane trimethacrylate, tetramethylolmethane tetramethacrylate, resorcinol dimethacrylate, p,p'-dihydroxydiphenyl dimethacrylate and bisphenol A diglycidyl dimethacrylate, diallyl phthalate, diallyl acrylamide, methylenebisacrylamide and 5,5-diallyl barbituric acid, etc., with diethylene glycol diacrylate, triethylene glycol diacrylate, tetraethylene glycol diacrylate, neopentyl glycol diacrylate, trimethylolpropane triacrylate and tetramethylolmethane tetraacrylate, and the corresponding methacrylates being preferred.

In addition to the compounds having two or more ethylenically unsaturated bonds, there are compounds having two or more azide groups such as p,p'-diphenyl-bis(azide)methane and p,p'-bis(azide)benzophenone, etc., which have a cross-linking ability. However, they are not preferred because the preservation stability of azide groups thereof is inferior.

As exemplified above, if the cross-linking agent has good compatibility with the copolymers (I') and (II), it does not create any problems during developing with the alkaline developing solution. Furthermore, it need not be soluble in the alkaline developing solution. The cross-linking agent to be added to the photohardenable materials is selected from the above exemplified compounds and analogous compounds thereof. When selecting an agent consideration is given to its photosensitivity, corrosion resistance of photohardened patterns and compatibility with copolymers (I') and (II), etc. Two or more cross-linking agents may be added simultaneously. Preferably, the amount of the cross-linking agents is in a range of about 10 to 100% by weight based on a total of amounts of copolymers (I') and (II). However, the amount of the agents used may be outside the abovedescribed range depending on the particular end use of the products. The presence of these cross-linking agents is indispensible to corrosion resistance of the photohardened patterns and adhesion to the substrate. It is presumed that they also function as plasticizers for photohardened patterns.

Known photoactivators may be used in connection with the invention. Examples of these photoactivators include ketones and derivatives thereof and quinoid compounds, for example, benzophenone, benzil, p,p'-bis(dimethylamino)benzophenone, p,p'-bis(diethylamino)benzophenone, p,p'-dibenzoylbenzene, benzoin methyl ether, benzoin ethyl ether, benzoin isopropyl ether, anthraquinone, acenaphthoquinone, 2-tert-butylanthraquinone and phenanthrenequinone, thio analogues of ketones, for example, p,p'-bis(dimethylamino)thiobenzophenone, heterocyclic compounds, for example, primulin, carbazole, N-methyl-3-nitrocarbazole, xanthone, thioxanthone, chlorothioxanthone and diisopropylthioxanthone, and polyhaloalkanes and derivatives thereof, for example, carbon tetrabromide, $\omega,\omega,\omega$-tribromomethylphenyl sulfone and $\omega,\omega,\omega$-tribromomethylphenyl ketone, etc. Of these classes, the ketones and derivatives thereof, benzophenone and derivatives thereof, benzil, and benzoin alkyl ethers are preferred.

The photoactivator is added in an amount in the range of about 0.01 to 20%, preferably about 0.1 to 10%, by weight based on the total amounts of the copolymers (I') and (II) and the cross-linking agent.

It is also preferable to add a thermal polymerization inhibitor in order to prevent a cross-linking reaction of the compounds having ethylenically unsaturated bonds during preservation. For this purpose, it is possible to utilize hydroquinone, p-methoxyphenol, pyrogallol, 2,6-di-tert-butyl-p-cresol and cupferron, etc. The thermal polymerization inhibitor is generally added in an amount in the range of about 0.001 to 1% by weight based on the total amount of the copolymers (I') and (II) and the cross-linking agent.

It is also possible to add known dyes or finely-divided pigment particles as a coloring agent to form colored patterns so as to facilitate discrimination of the photohardened patterns after development. In addition, it is possible to add a surface active agent in order to improve the leveling and wetting property with respect to the surface of a substrate when forming a photohardenable layer on the substrate. Examples of the coloring agent and the surface active agent used are described in the following Examples.

When producing high contrast images or image patters for decoration or marking, etc. using the photohardenable material, it is necessary to add dyes or, preferably, pigments in a high density. However, this is not necessary with respect to discrimination of photohardened patterns. Particularly, in order to produce black contrast images, it is preferable to use pigments such as carbon black or iron black. The amount of the pigments in such a case is in the range of about 10 to 300% by weight based on the total amount of the copolymers (I') and (II) and the cross-linking agent. In a similar manner, when producing image patterns, dyes or, preferably, pigments having various desired colors such as yellow, orange, red, blue, green or white are added in similar amounts. When using the photohardenable material for forming these kinds of images, the coloring agent is, of course, one of the essential components, and it can be selected from various dyes and pigments available in the market. In addition, when using them for discrimination of photohardened patterns, the coloring agent is added in an amount in the range of about 0.05 to 5% by weight based on a total of amounts of the copolymers (I') and (II) and the cross-linking agent.

Although it is possible to laminate the substrate with the photohardenable material previously molded in the form of a sheet or film, the photohardenable layer is generally formed by dissolving it in an organic solvent, pouring it on the surface of the substrate and evaporating the solvent. Examples of substrates used include films or boards of plastic or resins (e.g., polyesters, polyamides, polyvinyl chloride, ABS resin, etc.), natural or synthetic papers, metals, metal oxides or metal alloys (e.g., aluminum, copper, iron, chromium, nickel, alumina, stainless steel, phosphor bronze, etc.), glass and the like. Examples of organic solvents used for this purpose include ketones such as acetone, methyl ethyl ketone or cyclohexanone, etc., Cellosolves (ethylene glycol monoalkyl ethers) such as Methyl Cellosolve, Ethyl Cellosolve or Butyl Cellosolve, etc., lower fatty acid esters of Cellosolves such as Methyl Cellosolve acetate or Ethyl Cellosolve Acetate, etc., alcohols and cyclic ethers such as methyl alcohol, isopropyl alcohol, tetrahydrofuran or dioxane, etc., and nonproton polar solvents such as N-methylpyrrolidone or dimethylformamide, etc., which can be used alone. Further, benzenoid, ester, haloalkene and haloalkane solvents such as benzene, toluene, xylene, monochlorobenzene, ethyl acetate, butyl acetate, dichloroethylene, trichloroethylene or trichloromethane, etc., may be utilized as solvents for the photohardenable materials by mixing with the above-described solvents which can be used alone.

The solution of the photohardenable material in the solvent (referred to as photohardenable solution, hereinafter) has a viscosity which is greatly different depending on the purpose of use or the method of coating the photohardenable solution for forming the photohardenable layer. However, the viscosity is generally adjusted to within the range of about 5 cps to 500 cps at 25° C.

The photohardenable solution can be applied to the substrate not only by means of a roll coater, a wire bar coater, a gravure coater or a curtain coater but also by spray coating, dip and squeeze coating or whirler coating, etc. A number of different methods known in this field can be adopted without difficulty.

The photohardenable layer on the substrate is obtained by volatilizing the solvent in the photohardenable solution. The volatilizing is carried out by heating or allowing to stand at room temperature. The photohardenable layer formed generally has a dry film thickness of about 0.3 micron to 100 microns.

The photohardenable layer may be laminated with a protective film transparent to active rays, or a solution of an insensitive high molecular weight compound such as polyvinyl alcohol may be applied to the photohardenable layer followed by drying to form a laminated film. This kind of lamination is carried out in order to prevent interference of photohardening due to oxygen in the air when irradiated with active rays. However, in the photohardenable materials of the present invention, it is not necessary to provide such an oxygen preventing layer in conventional uses, because the photosensitivity is sufficiently high.

Examples of useful light sources of active rays for photohardening the photohardenable layer include low pressure-, medium pressure-, high pressure- or ultrahigh pressure mercury vapor lamps which emit intensive light in an ultraviolet part or a near-ultraviolet part, metal halide enclosing mercury vapor lamps, xenon lamps, and carbon arc lamps, etc.

Usually, the active rays are applied through an original pattern, through which active rays do not pass. The pattern is provided on a plastic film or a glass plate through which the active rays pass. Since the photohardenable layer corresponding to the non-image part where the pattern is not present, it is hardened by light. Accordingly, a negative pattern of the original pattern is obtained by processing with an alkaline developing solution after exposure to light.

The alkaline developing solution generally utilized is an aqueous solution containing several % of inorganic basic salts such as sodium carbonate or sodium silicate, etc., or organic bases such as monoethanolamine or diethanolamine, etc.

Development can be carried out by means of an available automatic developing apparatus equipped with a sprayer or by dipping the exposed photohardenable layer in the developing solution for a short time.

It is possible to obtain a lithographic printing plate by making use of the oleophilic property and firm adhesive property of the image patterns on a flat substrate of aluminum, zinc or chromium. Positively printed copies of the image pattern can be obtained with the lithographic printing plate using a negative original, because the photohardened image pattern is ink-receptive. Lithographic printing materials which are made have image patterns with excellent resolving power, printing durability, ink-philic property and ink-transfer property.

Further, the image pattern can be utilized as a resist layer for steps such as etching, plating or honing of substrates, as occasion demands. In such cases, it is necessary to remove the photohardened image pattern after conclusion of the above-described processing. The removal can be easily carried out by dipping in an aqueous solution containing about 5% caustic alkali.

In the following, the present invention is illustrated in greater detail with reference to Examples. All parts in the Examples are by weight.

EXAMPLE 1

| (Copolymer (I')) | Copolymer of Preparation Example 1 | 90 parts |
| --- | --- | --- |
| (Copolymer (II)) | Copolymer of Preparation Example 12 | 10 parts |
| (Cross-linking agent) | Triethylene glycol dimethacrylate | 20 parts |
| | Neopentyl glycol diacrylate | 10 parts |
| (Photoactivator) | Benzoin isopropyl ether | 8 parts |
| | p,p'-bis(dimethylamino)-benzophenone | 4 parts |
| (Thermal polymerization inhibitor) | p-Methoxyphenol | 0.01 part |
| (Coloring agent) | C. I. Solvent Blue 2 | 1 part |
| (Surface active agent) | Polyoxyethylene sorbitan monolaurate | 0.05 part |

The above-described components were dissolved in 500 parts of Ethyl Cellosolve to obtain a photohardenable solution having a viscosity of 55 cps (25° C.).

The above-described photohardenable solution was applied to the chromium face of a multilayer metal plate. The plate was produced by National Hard Chrome Co. in U.S.A., and obtained by electroplating both sides of a 0.3 mm iron plate with copper to a thickness of about 3μ, and plating one side with chromium to a thickness of about 5μ. The above-described photohardenable solution was applied by means of a roll coater to prepare a printing plate provided with a photohardenable layer having a dry film thickness of 2.5μ.

A negative original was brought into contact with the photohardenable layer of the printing plate by a vacuum printing frame, and the photohardenable layer was irradiated with a 3 kW high pressure mercury vapor lamp at a distance of 1 m (light intensity: 4.5 mW/cm²) for 20 seconds.

The exposed printing plate was developed by immersing it in a developing solution composed of an aqueous solution containing 5% by weight sodium silicate, 8% by weight of sodium phosphate and 0.1% by weight of sorbitan distearate at 25° C. for 90 seconds, followed by washing with water, applying a solution of gum arabic and drying in air to obtain a positive printing plate.

When printing was carried out on an offset press, 500,000 copies of good printed matter were obtained. Furthermore, the pattern of the printing plate remained stable and was capable of continuing printing.

Likewise, a printing plate provided with a photohardenable layer having a dry film thickness of about 2μ on an aluminum plate (thickness: 0.24 mm) which was processed by brush polishing or electropolishing was subjected to exposure to light, development, washing with water and application of gum by the same procedure as described above to obtain an aluminum substrate printing plate.

The above-described aluminum substrate printing plate was put on an offset press. When printing was carried out using alkaline dampening water having a pH of 10.5, more than 150,000 copies of good printed matter were obtained.

Two kinds of unexposed printing plates were obtained using the above-described photohardenable solution and the multilayer metal plate or the matted aluminum plate. These plates were examined after being preserved at room temperature for 1 year, no change was observed in photosensitivity, resolving power, developing ability and printing durability, and they had sufficient preservation stability.

EXAMPLES 2 TO 20

A number of photohardenable solutions were prepared by changing the kinds of the copolymers (I') and (II) and varying the ratio of the copolymer (I') to the copolymer (II) as shown in Table 3. However, the total amount of the copolymers (I') and (II) was 100 parts, and other components except for the copolymers (I') and (II) were as follows.

| (Cross-linking agent) | Tetraethylene glycol diacrylate | 13 parts |
| --- | --- | --- |
| | Trimethylolpropane triacrylate | 10 parts |
| | Diethylene glycol dimethacrylate | 15 parts |
| (Photoactivator) | Benzophenone | 10 parts |
| | p,p'-Bis(diethylamino)benzophenone | 2 parts |
| (Thermal polymerization inhibitor) | Cupferron | 0.005 part |
| (Coloring agent) | C. I. Solvent Blue 2 | 1 part |
| (Surface active agent) | Fluorad FC-430 (fluorine containing surface active | 0.01 part |

-continued

| (Solvent) | agent produced by Sumitomo 3 M Co.) Ethyl Cellosolve | 500 parts |
|---|---|---|

Printing plates were produced using the abovedescribed photohardenable solutions and the same multilayer metal plate as in Example 1. The plates were subjected to exposure to light, development, washing with water and the application of gum by the same procedure as in Example 1. Results of examination are described in Table 4.

In order to compare with the Examples, the Comparative Examples are shown in Table 3 and Table 4. In Table 4, the composition of the copolymers (the total amount of which is 100 parts), in the photohardenable solutions, and results of examination are shown. In the Comparative Examples, production if the printing plates and developed printing plates were obtained according to Example 1.

TABLE 3

| Example and Comparative Example | Copolymer (I') Preparation Example | Part | Copolymer (II) Preparation Example | Part |
|---|---|---|---|---|
| 2 | 1 | 50 | 12 | 50 |
| 3 | 1 | 75 | 14 | 25 |
| 4 | 1 | 90 | 15 | 10 |
| 5 | 1 | 80 | 17 | 20 |
| 6 | 1 | 80 | 18 | 20 |
| 7 | 2 | 90 | 16 | 10 |
| 8 | 3 | 55 | 13 | 45 |
| 9 | 6 | 90 | 19 | 10 |
| 10 | 7 | 95 | 17 | 5 |
| 11 | 8 | 85 | 16 | 15 |
| 12 | 8 | 40 | 16 | 60 |
| 13 | 9 | 65 | 16 | 35 |
| 14 | 10 | 65 | 16 | 35 |
| 15 | 10 | 40 | 13 | 60 |
| 16 | 11 | 60 | 13 | 40 |
| 17 | 11 | 85 | 15 | 15 |
| 18 | 11 | 85 | 16 | 15 |
| 19 | 11 | 90 | 16 | 10 |
| 20 | 11 | 70 | 18 | 30 |
| C-1 | 1 | 100 | — | |
| C-2 | 4 | 100 | — | |
| C-3 | 5 | 100 | — | |
| C-4 | — | | 13 | 100 |
| C-5 | — | | 16 | 100 |
| C-6 | — | | 18 | 100 |
| C-7 | 4 | 50 | 13 | 50 |
| C-8 | 5 | 50 | 13 | 50 |
| C-9 | 1 | 97 | 17 | 3 |
| C-10 | 1 | 30 | 17 | 70 |

TABLE 4

| Example and Comparative Example | State of Coating Film | photo-sensitivity | Developing Property | Resolving Power | Ink Receptivity and Transfer Property | Dampening Water Resistance IPA | Dampening Water Resistance Alkali | UV Ink Resistance | Printing Endurance |
|---|---|---|---|---|---|---|---|---|---|
| 2 | A | B | A | A | A | B | B | A | A |
| 3 | A | A | A | A | A | A | A | A | A |
| 4 | B | A | A | A | A | A | A | A | A |
| 5 | A | A | A | A | B | A | B | A | A |
| 6 | A | A | A | A | A | A | A | A | A |
| 7 | A | A | B | A | A | A | A | A | A |
| 8 | A | B | A | B | B | B | B | B | B |
| 9 | B | A | B | A | A | B | B | A | A |
| 10 | B | A | A | A | B | A | B | B | A |
| 11 | B | B | B | B | A | B | A | A | A |
| 12 | B | B | B | B | A | B | B | A | B |
| 13 | B | B | A | B | A | B | B | B | A |
| 14 | B | B | A | A | A | A | B | B | A |
| 15 | B | B | A | A | A | B | B | B | B |
| 16 | A | B | A | A | A | B | B | A | B |
| 17 | A | A | B | A | A | A | A | A | A |
| 18 | A | A | A | A | A | A | A | A | A |
| 19 | A | A | B | B | A | A | A | A | A |
| 20 | A | A | A | A | A | A | A | A | A |
| C-1 | C | A | B | B | B | B | B | B | A |
| C-2 | C | A | C | C | B | A | A | A | — |
| C-2 | C | C | A | C | C | C | C | A | — |
| C-3 | C | C | A | C | C | C | C | A | — |
| C-4 | A | C | A | B | A | B | C | B | — |
| C-5 | A | C | A | B | A | B | C | B | B |
| C-6 | A | C | A | B | A | B | C | B | — |
| C-7 | C | B | C | C | B | B | B | B | — |
| C-8 | B | C | A | C | C | B | C | B | — |
| C-9 | C | A | C | B | B | A | A | A | A |
| C-10 | A | C | A | B | A | B | B | B | B |

Evaluations A, B and C in Table 4 correspond to excellent, good and passable to bad. In more detail, the evaluations A and B correspond to "superior in performance" and "practically employable without problem", respectively. In contrast, the evaluation C means that the formulation is not suitable for practical application without paying special precautions to get rid of difficulty. Further, in the photohardenable solution of Comparative Example 1, fine gelatinized particles were formed after being preserved at room temperature for 3 months. Moreover, the photohardenable solution of Comparative Example 4 gelatinized after being preserved at room temperature for 1 month.

State of coating film: After the photohardenable solution was applied by a roll coater and a whirler, it was examined to determine whether a uniform membrane could be formed. At the same time, it was examined to determine whether the surface of the photohardenable layer had stickiness when the photohardenable layer was brought into contact with the original. In this case, the evaluations A, B and C mean as follows:

A: No resistance in the peeling-apart process.
B: Only feeble resistance was felt during the peeling-apart process, but it caused no problem in practical uses.
C: The resulting film was sticky, and therefore, the peeling-apart process had to be carried out with precautions causing nuisance.

Photosensitivity: Photosensitivity was determined by measuring the exposure time required for giving (or leaving) 6 solid steps after development using a $\sqrt{2}$ step tablet (Kodak Step Tablet No. 2). For the sake of confirmation that the photohardening was sufficient, the solid steps on the substrate were rubbed hardly with a sponge. In this case, times for exposure corresponding to evaluations A, B and C were respectively below 20 seconds, 40 seconds and above 60 seconds.

Developing property: The printing plate was immersed in a developing solution composed of an aqueous solution containing 5% by weight of sodium silicate, 8% by weight of sodium phosphate and 0.1% by weight of sorbitan distearate. The plate was then softly rubbed with a sponge. The developing property was determined by measuring the developing time as well as presence or absence of development residues. In this case, the evaluations A, B and C mean as follows:

A: developing time=ca. 60 seconds, tolerance: excellent
B: developing time=ca. 100 seconds, tolerance: good
C: developing time=over 180 seconds, tolerance: poor (scumming existed).

Resolving power: A test pattern of 175 lines/inch was used, and the dot shape of 98% to 2% was examined to determine the resolting power. In this case, the evaluations A, B and C mean as follows:

A: definition of dots: excellent reproducibility of the dots from 98% to 2% (hereinafter the same): excellent
B: definition of dots: acceptable reproducibility of dots: good and practically usable
C: definition of dots: unacceptable reproducibility of dots: unacceptable Ink-receptivity and transfer property (adhesion of inks to the printing plate and transfer of inks to a rubber blanket from the printing plate): After printing was carried out by means of two-color printer produced by Heidelberg Co. in West Germany, the printing state of the printed matter and the number of "yare" (lost paper appearing at the beginning of printing) were examined. In case of "yare", A, B and C correspond respectively to less than 20 sheets, 20 to 30 sheets, and more than 30 sheets which develop problems in practical use.

Dampening water resistance: Using IAP (isopropyl alcohol containing dampening water available in the market) and alkali dampening water (available dampening water the alkalinity of which was adjusted to pH 10.5), printing was carried out. Swelling resistance and dissolution resistance of the face of printing plates were examined by rubbing with a sand containing eraser.

Printing was actually carried out with some of the examples and dampening water was used with the other examples.

UV ink resistance: After printing was carried out using an ultraviolet ray hardenable ink available in the market, the degree of damage on the face of printing plates was examined.

Printing durability: Evaluations A, B and C correspond respectively to more than 300,000 sheets, 100,000 to 300,000 sheets (damage or wear of the face of printing plates is expected at the upper limit), and less than 100,000 sheets.

EXAMPLE 21

| | | |
|---|---|---|
| (Copolymer (I')) | Copolymer of Preparation Example 1 | 75 parts |
| (Copolymer (II)) | Copolymer of Preparation Example 16 | 25 parts |
| (Cross-linking agent) | Diethylene glycol diacrylate | 20 parts |
| | Neopentyl glycol diacrylate | 15 parts |
| (Photoactivator) | 2-tert-Butylanthraquinone | 6 parts |
| | p,p'-Bis(dimethylamino)-benzophenone | 4 parts |
| (Thermal polymerization inhibitor) | Hydroquinone | 0.01 part |
| (Coloring agent) | C. I. Solvent Blue 73 | 2 parts |
| (Surface active agent) | Polyoxyethylene sorbitan monolaurate | 0.05 part |

The above-described components were dissolved in a mixture composed of 300 parts of Ethyl Cellosolve, 100 parts of Methyl Cellosolve and 100 parts of isopropyl alcohol to prepare a photohardenable solution having a viscosity of 35 cps (25° C.).

To a 1 ounce copper clad phenol resin laminate board which was subjected to alkali degreasing treatment and 3% hydrochloric acid treatment, the above-described photohardenable solution was applied by a roll coater to form a photohardenable layer having a dry film thickness of 6μ. The photohardenable layer was brought into contact with a negative original for printed wiring and irradiated with a 3 kW high pressure mercury vapor lamp at a distance of 1 m (light intensity: 4.5 mW/cm$^2$) for 25 seconds.

The photohardenable layer was developed by immersing in a 10 wt% aqueous solution of sodium carbonate at 25° C. for 2 minutes to form a positive pattern. After carrying out etching of the copper while keeping a 45° Bé aqueous solution of FeCl$_3$ at 40° to 45° C. followed by washing with water, the processed plate was immersed in a 6 wt% aqueous solution of NaOH at 25° C. for 2 minutes and the photohardened part was removed to obtain a printed circuit board.

The copper pattern obtained by the above-described processing had edges having remarkably excellent sharpness. No intrusion of the copper etching solution was observed. It exhibited a resolving power of 60μ linewidth.

The above-described positive pattern was then subjected to etching at 45° C. for 2 minutes using an alkaline etching solution (produced by MacDermid Co. in U.S.A.; METEX Continuetch MU-9110) (above pH 8.5) and the photohardened part was removed similarly. When the copper pattern was examined, edges of the pattern were sharp and pinholes were not observed.

EXAMPLES 22 TO 25

The copolymers (I') and (II) were used in ratios described in Table 5 wherein the total amounts of them were 100 parts. Photohardenable solutions having a viscosity of 10 to 12 cps (25° C.) were prepared using the following composition as other components.

| | | |
|---|---|---|
| (Cross-linking agent) | Neopentyl glycol diacrylate | 20 parts |
| | Diethylene glycol diacrylate | 35 parts |
| | Triethylene glycol diacrylate | 10 parts |
| (Photoactivator) | Benzophenone | 10 parts |
| | p,p'-Bis(diethylamino)benzophenone | 4 parts |
| (Thermal polymerization inhibitor) | p-Methoxyphenol | 0.05 part |
| (Coloring agent) | C. I. Solvent Blue 2 | 2 parts |
| (Surface active agent) | Polyoxyethylene sorbitan monolaurate | 0.1 part |

TABLE 5

| | Copolymer (I') | | Copolymer (II) | |
|---|---|---|---|---|
| Example | Preparation Example | Part | Preparation Example | Part |
| 22 | 1 | 75 | 16 | 25 |
| 23 | 6 | 82 | 12 | 18 |
| 24 | 9 | 82 | 19 | 18 |
| 25 | 11 | 80 | 12 | 20 |

Each of the above-described photohardenable solutions was applied to a copper plated roll (Ballard) (length: 60 cm, diameter: 20 cm) for gravure printing, followed by drying to form a photohardenable layer having a thickness of 6μ.

A halftone original for gravure printing was pressed against the roll, and each photohardenable layer was exposed to light by a 5 kW high pressure mercury vapor lamp at a distance of 30 cm (light intensity: 18 mW/cm$^2$) for 4 seconds while revolving the roll. The exposed roll was developed by spraying a 3 wt% aqueous solution of sodium silicate at 25° C. for 2 minutes.

Each roll was etched at 21° C. for 3 minutes using a 45° Bé aqueous solution of FeCl$_3$.

When the sharpness of the edges and size of halftone dots in each roll were measured by magnifying the halftone dots 100 times, sharpness and reproduction of halftone were excellent.

The halftone roll produced using the photohardenable solution in Example 22 was plated with chromium (plated layer: about 8μ). When gravure printing was carried out, gravure printed matters having remarkably excellent quality were obtained.

EXAMPLE 26

| | | |
|---|---|---|
| (Copolymer (I')) | Copolymer of Preparation Example 1 | 75 parts |
| (Copolymer (II)) | Copolymer of Preparation Example 15 | 25 parts |
| (Cross-linking agent) | Triethylene glycol diacrylate | 10 parts |
| | Tetraethylene glycol diacrylate | 30 parts |
| (Photoactivator) | Benzoin isopropyl ether | 5 parts |
| | p,p'-Bis(dimethylamino)-benzophenone | 3 parts |
| (Thermal polymerization inhibitor) | p-Methoxyphenol | 0.01 part |
| (Coloring agent) | C. I. Solvent Blue 73 | 2 parts |
| (Surface active agent) | Polyoxyethylene sorbitan monolaurate | 0.05 part |

The above-described components were dissolved in a mixture composed of 200 parts of Methyl Cellosolve and 150 parts of methyl ethyl ketone to prepare a photohardenable solution having a viscosity of 60 cps (25° C.).

The solution was applied by dip-coating it on a 0.1 mm stainless steel plate (SUS-304) degreased with 1,1,1-trichloroethylene, followed by drying at 80° C. for 10 minutes to form sensitive layers having an average thickness of 8μ on the both sides of the plate. Two negative original having a perforating pattern for producing mechanical parts were brought into contact with photohardenable layers on both layers so that the patterns of the negative original agreed with each other. Both sides of the plate were then exposed to light using a 2 kW high pressure mercury vapor lamp at a distance of 60 cm (light intensity 3.6 mW/cm$^2$) for 40 seconds. The exposed plate was then developed by spraying a 10 wt% aqueous solution of Na$_2$CO$_3$ on both sides at 30° C. for 40 seconds to form positive images.

Etching was then carried out with keeping a 45° Bé aqueous solution of FeCl$_3$ at 40° to 45° C. to produce a stainless steel perforation pattern. When it was examined, there was less side etching and pinholes were not observed.

The photohardened image was then completely stripped off (from the surface of the fabricated stainless steel) by dipping in a 5 wt% sodium hydroxide aqueous solution at 40° C. for 5 minutes. The etch factor was approximately 0.2 to 0.3. The definition of the perforation patterns was excellent, and there were no rough edges due to the infiltration of the etchant through the boundary of the photohardened layer and surface of the stainless steel. The pinhole being caused by a local intrusion of the etchant could not be detected by the inspection with the naked eyes.

Conclusively, the photosensitive material of this invention was found to be quite suitable for the etching resist.

While the invention has been described in detail and with reference to specific embodiments thereof, it will be apparent to one skilled in the art that various changes and modifications can be made therein without departing from the spirit and scope thereof.

What is claimed is:

1. A photohardenable material, comprising:
a copolymer (I') having ethylenically unsaturated bonds and having an acid value of about 5 to 180 and a molecular weight of about 1,500 to 100,000, the copolymer (I') being obtained by reacting carboxyl groups of a copolymer represented by formula (I)

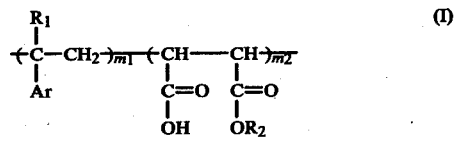

wherein Ar represents a phenyl group or a substituted phenyl group; R$_1$ represents a hydrogen atom or a methyl group; R$_2$ represents a lower alkyl group; and the numbers m$_1$ and m$_2$ represent each a ratio of each monomer in the copolymer, wherein they have a relation of $m_1 \geq m_2$, with a compound having an oxirane ring and an ethylenically unsaturated bond;

a copolymer (II) having a molecular weight of about 50,000 to 500,000 comprised of three monomers represented by formula (II)

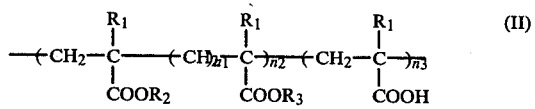

wherein $R_1$ represents a hydrogen atom or a methyl group; $R_2$ represents a lower alkyl group; $R_3$ represents a benzyl group, a substituted benzyl group having substituents on the phenyl ring, a tert-butyl group or an isobutyl group, but $R_2 \neq R_3$; and the numbers $n_1$, $n_2$ and $n_3$ represent each a ratio of each monomer in the copolymer, wherein they have relations of $n_1 < n_2$ and about $20 \geq (n_1+n_2)/n_3 \geq$ about 1;

a cross-linking agent having two or more ethylenically unsaturated bonds; and a photoactivator, wherein a ratio by weight of the copolymer (I') to the copolymer (II) is in a range of (I')/(II) being about 0.5 to 20.

2. A photohardenable material as claimed in claim 1, wherein the acid value of copolymer (I') is in the range of about 30 to 120.

3. A photohardenable material as claimed in claim 2, wherein the cross-linking agent is present in an amount of about 10 to 100% by weight based on the weight of the total of copolymer (I') and (II).

4. A photohardenable material as claimed in claim 1, wherein said compound having an oxirane ring and en ethylenically unsaturated bond is glycidyl acrylate, glycidyl methacrylate, allyl glycidyl ether, glycidyl α-ethylacrylate, crotonyl glycidyl ether, glycidyl crotonate or glycidyl isocrotonate.

5. A photohardenable material as claimed in claim 1, wherein said cross-linking agent has a boiling point of about 150° C. or more under atmospheric pressure, and contains ethylenically unsaturated bonds as an acryl residual group, a methacryl residual group or an allyl residual group.

* * * * *